(12) United States Patent
Mori et al.

(10) Patent No.: US 7,491,102 B2
(45) Date of Patent: Feb. 17, 2009

(54) PRINTED CIRCUIT WIRING BOARD AND ELECTRONIC APPARATUS

(75) Inventors: Tokihiko Mori, Kunitachi (JP); Masaya Hirashima, Oume (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/493,246

(22) Filed: Jul. 26, 2006

(65) Prior Publication Data

US 2007/0026724 A1 Feb. 1, 2007

(30) Foreign Application Priority Data

Jul. 26, 2005 (JP) ............................ P2005-216184

(51) Int. Cl.
*H01R 13/02* (2006.01)

(52) U.S. Cl. ..................... 439/886; 428/929; 439/887

(58) Field of Classification Search ................ 439/886, 439/887; 29/874, 882, 884; 428/208, 218, 428/616, 646, 929
See application file for complete search history.

(56) References Cited

U.S. PATENT DOCUMENTS

| | | | |
|---|---|---|---|
| 3,521,221 A * | 7/1970 | Lenaerts et al. ............. 439/402 |
| 3,555,497 A * | 1/1971 | Watanabe .................... 439/857 |
| 3,875,478 A | 4/1975 | Capstick |
| 3,975,076 A * | 8/1976 | Shida et al. .................... 439/62 |
| 4,466,689 A * | 8/1984 | Davis et al. .................. 439/801 |
| 4,684,183 A * | 8/1987 | Kinoshita et al. .............. 439/77 |
| 5,180,482 A * | 1/1993 | Abys et al. ................... 205/224 |
| 5,188,546 A * | 2/1993 | Ballard et al. ................ 439/885 |
| 5,306,874 A | 4/1994 | Biron |
| 6,056,572 A * | 5/2000 | Matsumoto et al. .......... 439/260 |
| 6,083,633 A * | 7/2000 | Fister et al. .................. 428/615 |
| 6,205,643 B1 * | 3/2001 | Brinkmann et al. ......... 29/527.1 |
| 6,612,880 B2 * | 9/2003 | Arnett et al. ................. 439/825 |
| 6,677,055 B1 * | 1/2004 | Chung et al. ................. 428/646 |
| 6,939,621 B2 * | 9/2005 | Hara et al. ................... 428/647 |
| 2002/0106944 A1 * | 8/2002 | Miyanoo et al. ............. 439/886 |
| 2004/0161626 A1 * | 8/2004 | Kwon et al. ................. 428/577 |
| 2005/0176267 A1 * | 8/2005 | Saitoh ........................... 439/49 |
| 2005/0211461 A1 * | 9/2005 | Horikoshi et al. ...... 174/117 FF |
| 2006/0016694 A1 * | 1/2006 | Tanaka et al. ................ 205/300 |

(Continued)

FOREIGN PATENT DOCUMENTS

JP 3106404 5/1991

(Continued)

*Primary Examiner*—Neil Abrams
(74) *Attorney, Agent, or Firm*—Knobbe, Martens, Olson & Bear LLP

(57) ABSTRACT

According to one embodiment, a printed circuit wiring board includes: a substrate having a conductor pattern thereon; a flexible flat cable including a connection section; and a connector including a contact section, a fitting port section and a housing. The contact section includes a first area and a second area provided on the first area. The first area contains copper. The second area has a surface containing tin and copper. The fitting port section is fitted to the connection section to connect with the contact section. The flexible flat cable includes a pair of insulating sheets and a plurality of conductors arranged therebetween. The conductors contain tin and copper and have the connection section on end portions. The connection section includes a first region and a second region provided on the first region. The first region contains copper. The second region has a surface containing tin and copper.

3 Claims, 3 Drawing Sheets

U.S. PATENT DOCUMENTS

| | | | |
|---|---|---|---|
| 2006/0025024 A1* | 2/2006 | Yamagami et al. | 439/886 |
| 2006/0134969 A1 | 6/2006 | Takaku et al. | |
| 2006/0163718 A1* | 7/2006 | Kurihara | 257/702 |
| 2007/0256856 A1* | 11/2007 | Ichikawa et al. | 174/257 |

FOREIGN PATENT DOCUMENTS

| | | | |
|---|---|---|---|
| JP | 2001-043745 | | 2/2001 |
| JP | 2002-042556 | | 2/2002 |
| JP | 2002-298963 | | 10/2002 |
| JP | 2003-082499 | | 3/2003 |
| JP | 2003-193289 | * | 7/2003 |
| JP | 2003-203245 | | 7/2003 |
| JP | 2004-179055 | | 6/2004 |
| JP | 2005-048205 | | 2/2005 |

* cited by examiner

PRINTED CIRCUIT WIRING BOARD AND ELECTRONIC APPARATUS

CROSS-REFERENCE TO RELATED APPLICATIONS

This application is based upon and claims the benefit of priority from Japanese Patent Application No. 2005-216184, filed Jul. 26, 2005, the entire contents of which are incorporated herein by reference.

BACKGROUND

1. Field

One embodiment of the invention relates to a printed circuit wiring board having a flexible flat cable, as well as to an electronic apparatus having electronic components connected to the printed circuit wiring board by means of the flexible flat cable.

2. Description of the Related Art

In order to reduce contact resistance and make electrical continuity superior, a copper wire which has been subjected to, e.g., tin-lead plating has hitherto been employed as a conductor to be used for a flexible flat cable. From an environmental viewpoint, nonuse of lead for various wires which are to be used in electronic equipment is desired. For this reason, applying a copper wire, which is plated with lead-free tin or a lead-free tin alloy, even to the conductor used in a flexible flat cable has been examined.

Even when the lead-free tin plating layer or the lead-free tin alloy plating layer is oxidized to thus form an oxidized tin film on the surface thereof, the oxidized tin coating film is easily rubbed off by means of friction or the like, which arises in a mating section, so that electrical conductivity is readily achieved. However, when the flexible flat cable that employs the copper wire plated with tin or a tin alloy is fitted to the connector, metal crystal—which grows into the shape of whiskers as a result of extrusion of metal molecules of a plated coating surface—, so-called whiskers arises by means of the stress exerted on the fitted portion to thus raise a possibility of occurrence of a short-circuit between conductors (see, e.g., JP-A-2005-48205).

When phosphor bronze plated with, e.g., lead-free tin or a lead-free tin alloy, is used as a contact section of a connector to be connected to a flexible flat cable, there occurs a problem of analogous whiskers arising in the surface of the contact as well.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

DETAILED DESCRIPTION

Figure 1:
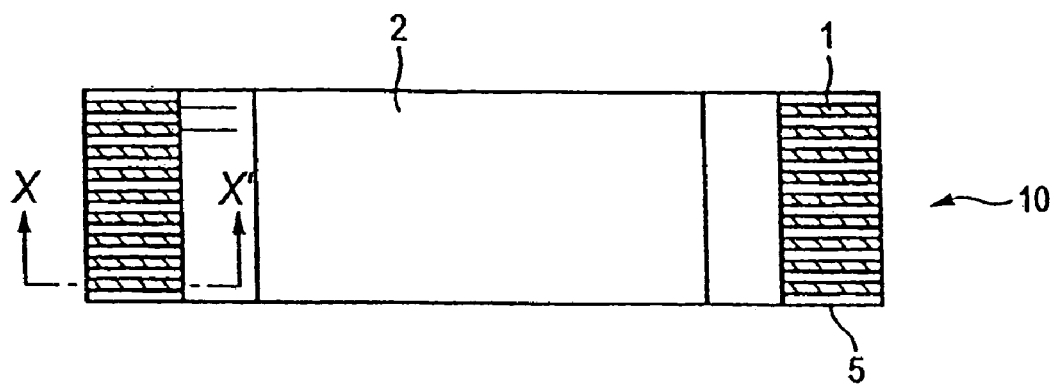
FIG. 1 is a schematic view showing an example flexible flat cable according to an embodiment.

Various embodiments according to the invention will be described hereinafter with reference to the accompanying drawings. In general, according to one embodiment of the invention, a printed circuit wiring board includes: a substrate; a conductor pattern provided on the substrate; a flexible flat cable including a connection section; and a connector provided on the substrate while being electrically connected to the conductor pattern. The connector includes a contact section, a fitting port section and a housing for retaining the contact section. The contact section includes a first area and a second area. The first area contains copper as a principal constituent. The second area is provided on the first area. At least a portion of a surface of the second area contains as principal constituents tin and copper originating from a tin-copper alloy. The fitting port section is fitted to the connection section to electrically connect with the contact section. The flexible flat cable includes a pair of insulating sheets and a plurality of conductors are aligned between the insulating sheets while spaced from each other. The plurality of conductors contain tin and copper and have end portions where the connection section is provided. The end portions are exposed from the insulating sheets. The connection section includes a first region and a second region. The first region contains copper as a principal component. The second region is provided on the first region. At least a portion of a surface of the second region contains tin and copper originating from a tin-copper alloy as principal components.

The electronic apparatus of the embodiment is realized by means of connecting an electronic component to the printed circuit wiring board by way of the flexible flat cable.

The conductor, which is used in the embodiment and contains tin and copper, is essentially made from tin and copper. The conductor does not contain lead, and possibly contains a trace amount of another element which does not affect characteristics of the conductor. The state of tin and copper in the conductor includes, for example, a combination of a copper phase, and a tin phase provided on the copper phase; a combination of a copper phase, and a tin-copper alloy phase provided on the copper phase; a combination of a copper phase, a tin phase provided on the copper phase, and a tin-copper alloy phase; and the like.

The first area and the first region, which are employed in the embodiment and contain copper as a principal component, correspond to the copper phase, and are essentially made of copper and do not contain lead. The first area and the first region possibly contain a trace amount of another element which does not affect characteristics of the area.

The second area and the second region, which are employed in the embodiment and which contain tin and copper as principal components, are essentially made of tin and copper; do not contain lead; and possibly contain a trace amount of another element which does not affect characteristics of the conductor. The composition of the second area and/or the second region includes, e.g., a combination of a copper phase, and a tin-copper alloy phase provided on the copper phase; and a combination of a copper phase, and a tin phase and a tin-copper alloy phase, both of which are provided on the copper phase. The tin-copper alloy layer exists in at least a portion of a surface of the second area or the second region.

According to the embodiment, as a result of the tin-copper alloy layer existing in at least a portion of the surface of the connection section and at least a portion of the surface of the contact section, occurrence of whiskers in the surface can be prevented. By means of prevention of occurrence of whiskers, a highly-reliable connection is achieved without involvement of occurrence of a short-circuit between the conductors, by use of an inexpensive, lead-free conductor.

The embodiment will be described hereinbelow in more detail by reference to the accompanying drawings.

Figure 2:
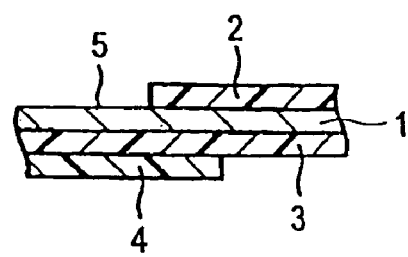
FIG. 2 is a cross-sectional view taken along line X-X' shown in FIG. 1.

FIG. 1 is a front view showing an example flexible flat cable used in the embodiment, and FIG. 2 is a cross-sectional view of the flexible flat cable taken along line X-X'.

As illustrated, the flexible flat cable 10 possesses flexibility and comprises a strip-shaped insulating sheet 3, a plurality of conductors 1, a strip-shaped insulating sheet 2, and a reinforcement plate 4. Here, the strip-shaped insulating sheet 3 is formed from, e.g., polyethylene terephthalate, or the like. The conductor 1 contains copper and tin, and a plurality of conductors 1 are aligned on the strip-shaped insulating sheet 3 while being spaced away from each other in a lateral (widthwise) direction of the flexible flat cable 10. The strip-shaped insulating sheet 2 is formed from, e.g., polyethylene terephthalate, and is laminated on the strip-shaped insulating sheet 3 by way of the conductors 1. The strip-shaped insulating sheet 2 is shorter than the strip-shaped insulating sheet 3, and both ends of the strip-shaped insulating sheet 2 are located further inside than both longitudinal ends of the plurality of conductors 1 (in the longitudinal direction thereof). Thereby, both ends of the conductors 1 are exposed, to thus constitute connection sections 5. The reinforcement plate 4 is provided on the surface of the strip-shaped insulating sheet 3 opposite the surface thereof on which the connection sections 5 are provided, so as to extend slightly inward from the area where the reinforcement plate 4 opposes the connection sections 5. Thus, the reinforcement plate 4 is provided in order to protect the connection sections 5 and maintain the strength thereof. The reinforcement plate 4 is formed from, e.g., polyethylene terephthalate or the like.

Figure 3:
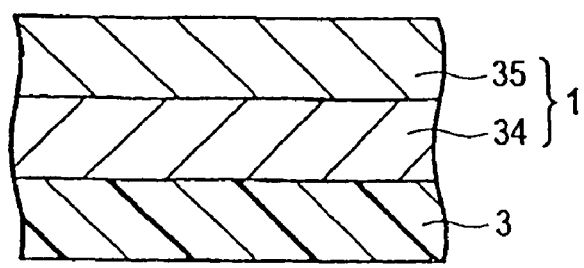
FIG. 3 is a diagrammatic cross-sectional view for describing the structure of a conductor layer in a connection section.

FIG. 3 shows a diagrammatic cross-sectional view for describing the configuration of the conductor in the connection section.

As illustrated, the exposed conductor 1 in the connection section 5 has a copper phase 34 formed on the strip-shaped insulating sheet 3, and a tin-copper alloy phase 35 provided on the copper phase 34, and the surface area of the conductor 1 is formed from a tin-copper alloy.

The exposed conductors 1 in the connection section 5 are obtained by means of: aligning copper wires on, e.g., the strip-shaped insulating sheet 3, while separating them from each other in the widthwise direction thereof; plating a tin layer on the copper wires; and annealing at least the connection sections at 220° C. to 300° C. Thus, a tin-copper alloy phase is formed on the copper phase such that at least a portion of the tin-copper alloy layer reaches a surface area. In a model view diagram shown in FIG. 3, only the tin-copper alloy phase is formed on the copper phase. However, in the embodiment, mixing of the tin phase and the tin-copper alloy phase on the copper phase is also allowed, so long as at least a portion of the tin-copper alloy phase has reached the surface area. When the annealing temperature is less than 220° C., acquisition of the tin-copper alloy phase is difficult. In contrast, when the annealing temperature has exceeded 300° C., cracks tend to arise in the conductor layer.

Figure 4:
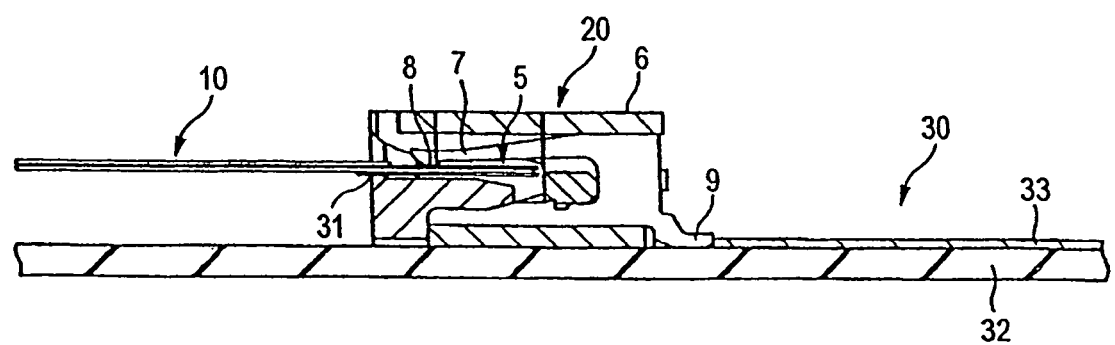
FIG. 4 is a view schematically showing an example printed circuit wiring board according to the embodiment.

FIG. 4 is a view diagrammatically showing an example printed circuit wiring board of the embodiment.

This printed circuit wiring board 30 comprises an insulating substrate 32; a conductor pattern 33 provided on the insulating substrate 32; a connector 20 electrically connected to the conductor pattern 33; and the flexible flat cable 10 inserted and connected to this connector 20. This connector 20 can be electrically connected to the conductor pattern 33 by means of soldering, e.g., a terminal 9 of the connector 20, and an unillustrated terminal connected to the conductor pattern 33.

The connector 20 comprises a contact section 7 formed from a conductor containing copper and tin, a fitting port 31 into which a connection section of a connection part is fitted, and a housing 6 for retaining the contact section 7.

This printed circuit wiring board 30 uses the flexible flat cable 10 having the same configuration as that shown in FIGS. 1 and 2, as a component for connecting the connector 20. The connection section 5 is inserted into the fitting port 31, to thus bring the conductors 1 into contact with the contact section 7 at a contact position 8. Thereby, a structure for connecting the flexible flat cable 10 to the connector 20 is formed.

Figure 5:
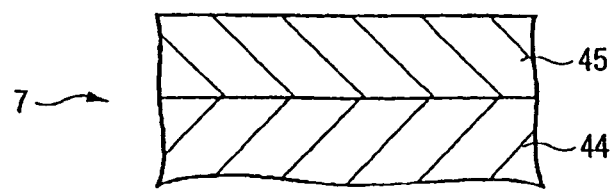
FIG. 5 is a diagrammatic cross-sectional view for describing the structure of the cross section of a contact surface.

FIG. 5 is a view for schematically showing a fragmentary cross section of a conductor which is used in the contact section and contains copper and tin.

As illustrated, a contact section 7 has a copper phase 44, and a tin-copper alloy phase 45 provided on the copper phase 44.

The contact section 7 is obtained by means of forming a tin layer on the main body of the contact made from, e.g., phosphor bronze, through plating; and annealing the thus-plated contact at a temperature from 220° C. to 400° C. As a result, the tin-copper alloy phase is formed on the copper phase such that at least a portion of the tin-copper alloy phase reaches the surface area. In the model view shown in FIG. 5, only the tin-copper alloy phase 45 is formed on the copper phase 44. However, in the embodiment, mixing of the tin phase and the tin-copper alloy phase on the copper phase is allowed, so long as at least a portion of the tin-copper alloy phase has reached the surface area.

This contact section employs, e.g., a thin plate of strip-shaped phosphor bronze, as the main body of the contact, and the inside of the contact main body is punched into a plurality of contact molds with both longitudinal ends of the contact being left, by use of metal molds. The thus-punched contacts are plated with a tin layer and annealed at 220° C. to 400° C. while remaining continuous, and the longitudinal ends and the individual contacts are separated from each other, whereby the contact sections are obtained.

When the annealing temperature is less than 220° C., the acquisition of a tin-copper alloy phase tends to become difficult. When the annealing temperature has exceeded 4000, cracks tend to arise in the surface of the tin plating layer. In connection with annealing of the flexible flat cable, cracks tend to arise in the tin plating layer when the annealing temperature has exceeded 300° C. Total heat capacity required by annealing of the contact sections, which is performed while the contact sections remains continuously punched by the plurality of contact molds, is great. Therefore, even when annealing is performed while the temperature has been increased to 400° C., cracks are less likely to arise in the tin plating layer.

Figure 6:
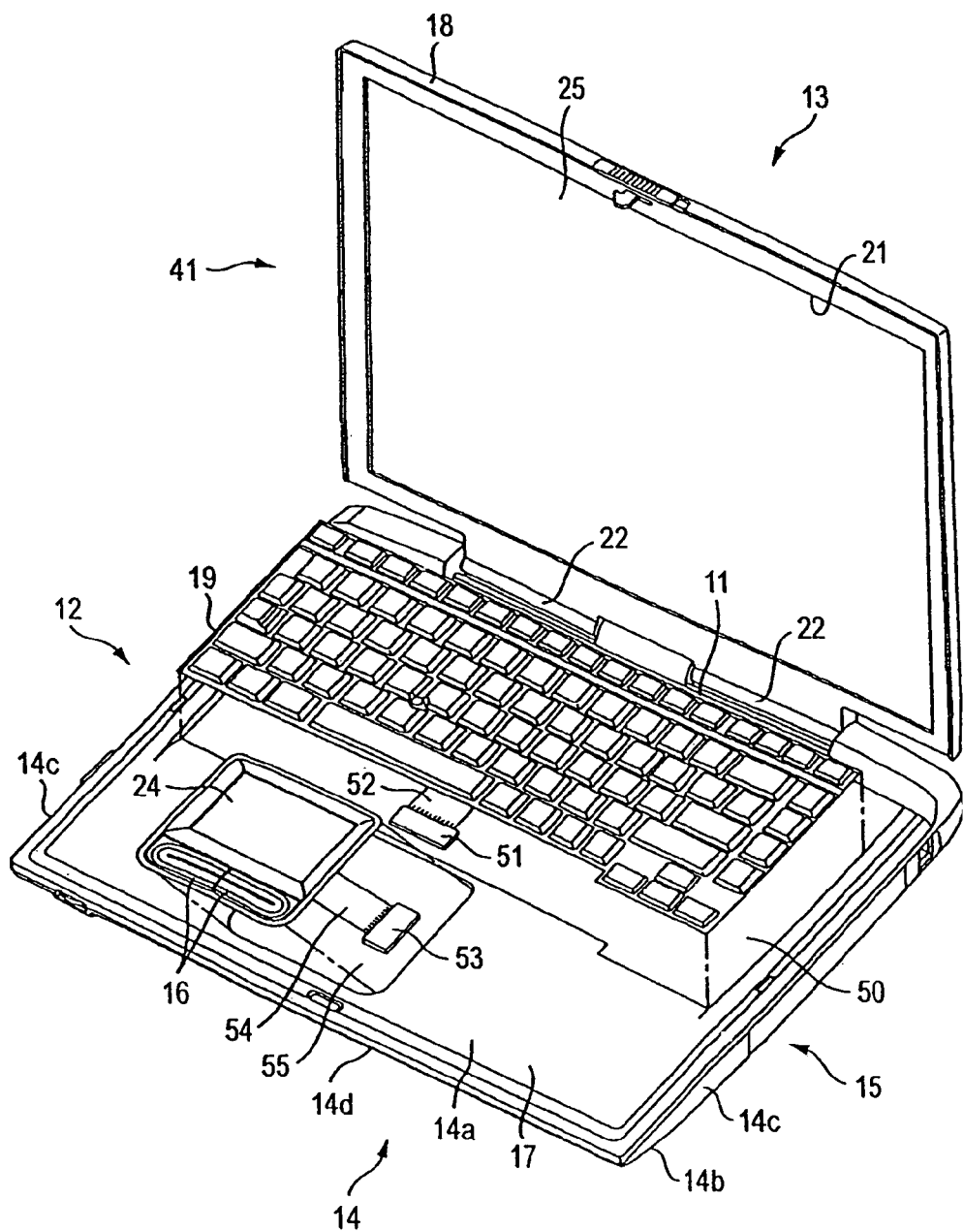
FIG. 6 is a schematic diagram showing an example of electronic apparatus equipment according to the embodiment.

FIG. 6 shows a schematic representation showing example electronic apparatus of the embodiment.

Here, a portable computer, which functions as an electronic apparatus, will be described. As illustrated, the portable computer 41 comprises an equipment main body 12, and a display unit 13 supported by the equipment main body 12. The equipment main body 12 has an enclosure 14 formed from, e.g., synthetic resin. The enclosure 14 has a top cover 14a acting as a first cover and a base cover 15 acting as a second cover. The enclosure 14 assumes the shape of a rectangular box with rounded corners. The base cover 15 integrally includes a bottom wall 14b opposing the top cover 14a, right and left side walls 14c standing around the bottom wall, a front wall 14d, and an unillustrated rear wall.

In the enclosure 14, a keyboard 19 is provided in the center of the top cover 14a. Here, the keyboard 19 remains disconnected. A connector 51 is mounted on a printed circuit wiring board 50 accommodated at a position below the keyboard 19, and one end of a flexible flat cable 52 is inserted into the connector 51. The other end of the flexible flat cable 52 is connected to a wiring board provided on the back of the keyboard 19.

A front end portion of the upper surface of the top cover 14a forms a palm rest section 17, and a touch pad 24 and a click button 16 are provided in essentially the center of the palm rest section 17. The touch pad 24 and the click button 16 remain disconnected. The printed circuit wiring board 50 is connected to a position below the touch pad 24 and the click button 16, and another printed circuit wiring board 55 having a connector 53 is accommodated at that position. One end of a flexible flat cable 54 is inserted into the connector 53. The other end of the flexible flat cable 54 is connected to a wiring board provided on the back of the touch pad 24 and the click button 16.

Unillustrated speakers are housed at rear right and left positions in the enclosure 14.

The display unit 13 has a housing 18 assuming the shape of a rectangular box with rounded corners, and a liquid-crystal display panel 25 housed in the housing 18. The liquid-crystal display panel 25 is exposed outside by way of a display window 21 formed in the housing 18. The housing 18 has a pair of leg sections 22 projecting from one end thereof. The leg sections 22 are pivotally supported by a rear end portion of the enclosure 14 by way of unillustrated hinge sections. Thereby, the display unit 13 can pivot between a close position where the display unit is closed so as to cover the keyboard 19 from the above, and an open position where the display unit stands upright behind the keyboard 19.

EXAMPLE

The embodiment will now be specifically described by means of an example.

Example 1

Manufacture of a Flexible Flat Cable

A copper wire having a diameter of 0.1 mm was plated with tin, to thus form a tin plating layer on the copper line. Subsequently, the copper line was subjected to rolling, whereby the copper wire having a thickness of 0.035 mm was obtained. This copper wire was introduced into an infrared heater whose surface heating temperature was set to 280° C., and heated for one minute. Subsequently, the copper wire was taken out of the infrared heater and left to cool.

This copper wire was formed into lines at uniform intervals on a strip-shaped insulating sheet, which is formed from heat-resistant polyethylene terephthalate and has a width of 30 mm, a length of 10 m, and a thickness of 0.0475 mm, by means of a laminator. Heat-resistant polyethylene terephthalate was laminated into a plurality of lines, each line having a length of, e.g., 100 mm, at an interval of 10 mm with the copper line sandwiched therebetween, to thus produce a strip-shaped insulating sheet where predetermined conductors are formed.

The strip-shaped insulating sheet was cut into pieces at predetermined positions, whereby flexible flat cables were created.

Manufacture of a Contact Section

A phosphor bronze thin plate roll having a thickness of 0.2 mm, a width of 30 mm, and a length of 10 m was prepared. A plurality of contact forms, each measuring 25 mm×25 mm, were punched from the inside of the roll by use of metal molds with both longitudinal ends, each of which has a width of only 5 mm, being left. The thus-punched phosphor bronze thin plate rollers were plated with tin, to thus form a tin plating layer. The phosphor bronze thin plate rolls were introduced into the infrared heater whose surface heating temperature had been set to 300° C.; heated for one minute; taken out of the infrared heater; and left to cool.

The phosphor bronze thin plate rolls were separated into pieces at predetermined positions and subjected to folding as necessary, whereby the contact sections were obtained.

A connector was assembled through use of the thus-obtained contacts, and the flexible flat cable was fitted to the connector. An inspection for occurrence of whiskers was performed by use of the connectors under the following circumstances.

Inspection for Occurrence of Whiskers

The connector to which was fitted the flexible flat cable was left for 4000 hours in the following environment: a temperature of 25° C.±2° C. and a relative humidity of 50% RH.

Test for Humidity Resistance

Likewise, the connector to which the flexible flat cable was connected was prepared, and left for 4000 hours in the following environment: a temperature of 60° C.±2° C. and a relative humidity of 93%±3%.

Test for Thermal Shock

Further, the connector to which the flexible flat cable was connected was similarly prepared, and repeatedly subjected to 1500 test cycles, wherein one cycle includes leaving the connector for 30 minutes in an environment of −40° C. and leaving the connector for 30 minutes in an environment of 85° C.

After the respective tests, the surface of the connection section of the flexible flat cable and the surface of the contact section of the connector were observed by means of a SEM (scanning electron microscope), to thus examine occurrence and lengths of whiskers.

Table 1 provided below shows the thus-obtained results.

TABLE 1

| TEST CONDITIONS | ROOM TEMPERATURE TEST | | HUMIDITY RESISTANCE TEST | | THERMAL SHOCK TEST | |
| --- | --- | --- | --- | --- | --- | --- |
| OBSERVED AREAS | CONNECTOR | FFC | CONNECTOR | FFC | CONNECTOR | FFC |
| DETERMINATION | EXCELLENT | EXCELLENT | EXCELLENT | EXCELLENT | EXCELLENT | EXCELLENT |

In Table 1, whiskers having lengths of less than 50 µm are designated as excellent; whiskers having lengths of from 50 µm to 100 µm are designated as good; and whiskers having lengths of 100 µm or more are designated as poor.

As shown in Table 1, whiskers having lengths of 50 µm or more did not arise in the connection section on the printed circuit wiring board of the embodiment between the flexible flat cable and the connector in any of the environments.

The invention is not limited to the foregoing embodiments but various changes and modifications of its components may be made without departing from the scope of the present invention. Also, the components disclosed in the embodiments may be assembled in any combination for embodying the present invention. For example, some of the components may be omitted from all the components disclosed in the embodiments. Further, components in different embodiments may be appropriately combined.

What is claimed is:

1. A printed circuit wiring board comprising:
    a substrate;
    a conductor pattern on the substrate;
    a flexible flat cable comprising a connection section; and
    a connector provided on the substrate, the connector comprising a contact section, a fitting port section and a housing configured to retain the connecting section of the flexible flat cable, the contact section comprising a first region comprising copper and a second region formed on the first region, at least a portion of a surface of the second region comprising tin and copper from a tin-copper alloy,
    wherein the contact section is obtained by annealing a copper main body and a tin layer plated on the copper main body until a tin-copper alloy phase existing on a copper phase reaches to at least the part of the surface region of the second region and the contact section is made by substantially annealing at a temperature from about 220° C. to about 400° C.; and
    the connection section is obtained by annealing a copper main body and a tin layer plated on the copper main body until a tin-copper alloy phase existing on a copper phase reaches to at least the part of the surface region of the second region and the connection section is made by substantially annealing, at a temperature from about 220° C. to about 300° C.

2. An electronic device comprising the printed circuit board of claim 1.

3. The electronic device of claim 2, wherein the electronic device is located within a computing device.

* * * * *

UNITED STATES PATENT AND TRADEMARK OFFICE
CERTIFICATE OF CORRECTION

PATENT NO. : 7,491,102 B2
APPLICATION NO. : 11/493246
DATED : February 17, 2009
INVENTOR(S) : Tokihiko Mori and Masaya Hirashima It is certified that error appears in the above-identified patent and that said Letters Patent is hereby corrected as shown below:

On the cover page item (30), under Foreign Application Priority Data, please delete "P2005-216184" and insert therefore, --2005-216184--

At column 4, line 51, please delete "4000" and insert therefore, --400°--

Signed and Sealed this
Thirty-first Day of May, 2011

David J. Kappos
*Director of the United States Patent and Trademark Office*